(12) United States Patent
Yoshida

(10) Patent No.: US 7,285,439 B2
(45) Date of Patent: Oct. 23, 2007

(54) METHOD FOR MANUFACTURING SEMICONDUCTOR DEVICE HAVING SHIELDING CASE, ELECTRONIC EQUIPMENT USING THE SEMICONDUCTOR DEVICE, AND SHIELDING CASE ATTACHING METHOD

(75) Inventor: Hiroshi Yoshida, Hashimoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 272 days.

(21) Appl. No.: 10/974,858

(22) Filed: Oct. 28, 2004

(65) Prior Publication Data

US 2006/0019432 A1    Jan. 26, 2006

(30) Foreign Application Priority Data

Oct. 31, 2003    (JP)    ............................ P2003-373230

(51) Int. Cl.
*H01L 21/00*    (2006.01)
(52) U.S. Cl. ..................................... 438/67; 257/E21.5
(58) Field of Classification Search .................. 438/67
See application file for complete search history.

(56) References Cited

U.S. PATENT DOCUMENTS 5,671,531 A * 9/1997 Mugiya ........................ 29/840

6,351,027 B1 * 2/2002 Giboney et al. ............. 257/684
6,700,138 B2 * 3/2004 Crane et al. ................... 257/99
7,074,638 B2 * 7/2006 Maeda et al. .................. 438/75

FOREIGN PATENT DOCUMENTS

| JP | 7-245420 A | 9/1995 |
|----|------------|--------|
| JP | 2000-236102 A | 8/2000 |
| JP | 2001-160596 A | 6/2001 |

* cited by examiner

*Primary Examiner*—David A. Zarneke
(74) *Attorney, Agent, or Firm*—Birch, Stewart, Kolasch & Birch, LLP

(57) ABSTRACT

A shielding case bank has shielding cases that arranged at a pitch twice as large as a pitch of molded articles in a molded article bank. Two shielding case banks are stacked one on the other with displacement from each other by half the pitch so that the shielding cases are as a whole arranged as the same pitch as the molded articles. The stacked shielding case banks are mounted on the molded article bank so that each shielding case covers a front face, both side faces, and a top face of the corresponding molded article. Each molded article and the corresponding shielding case are fixed to each other, and a back face of each molded article is covered. After that, guide frames of the shielding case banks are sequentially separated from the shielding cases, and the molded article bank is divided into discrete molded articles.

12 Claims, 11 Drawing Sheets

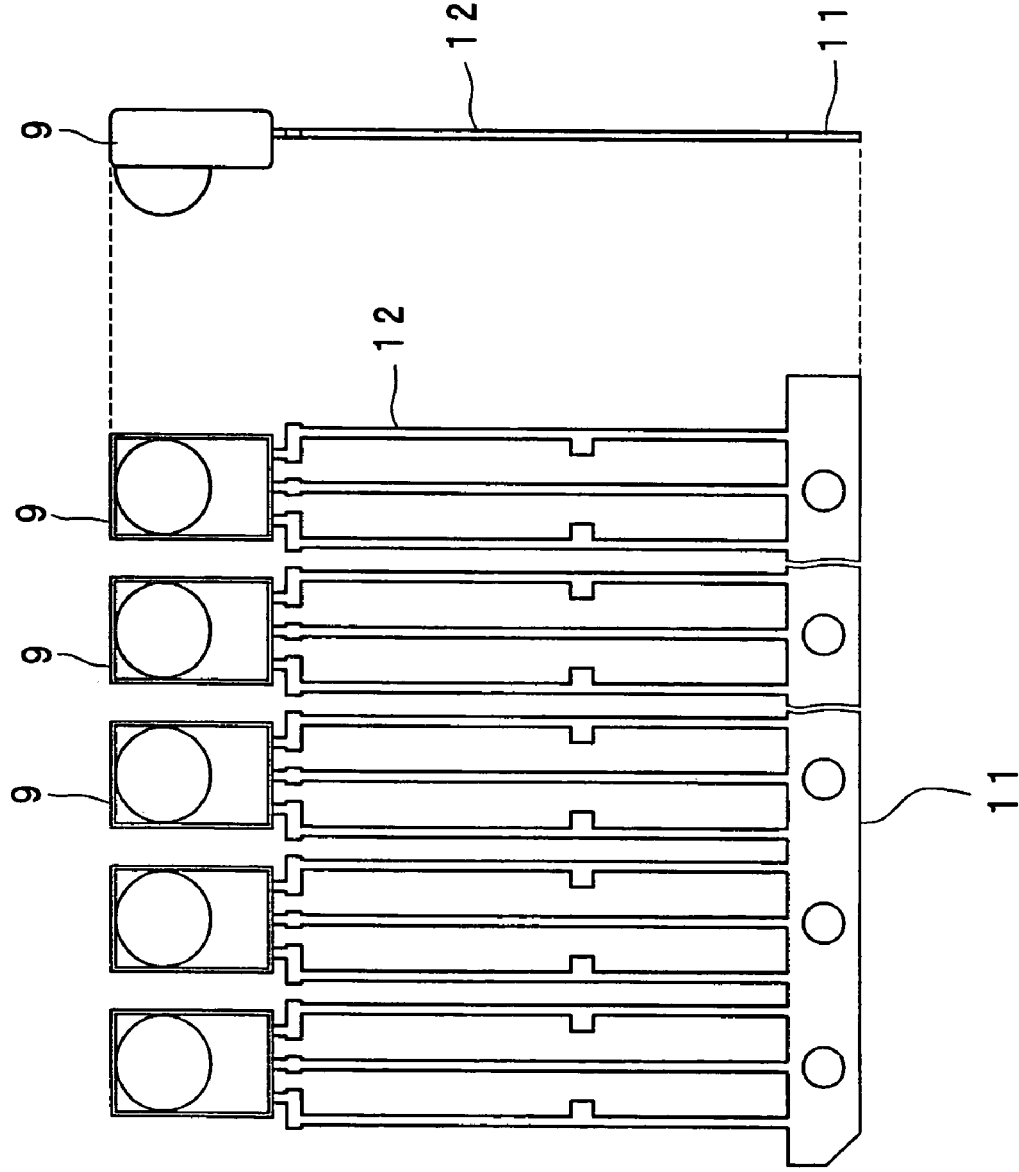

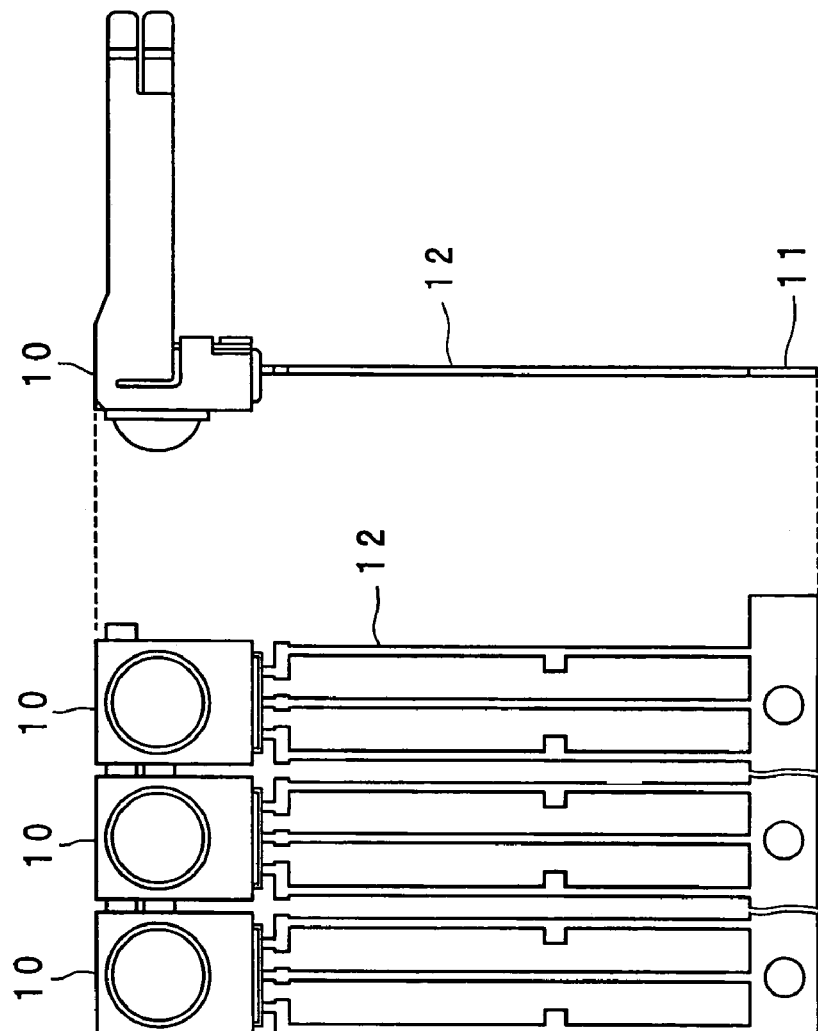
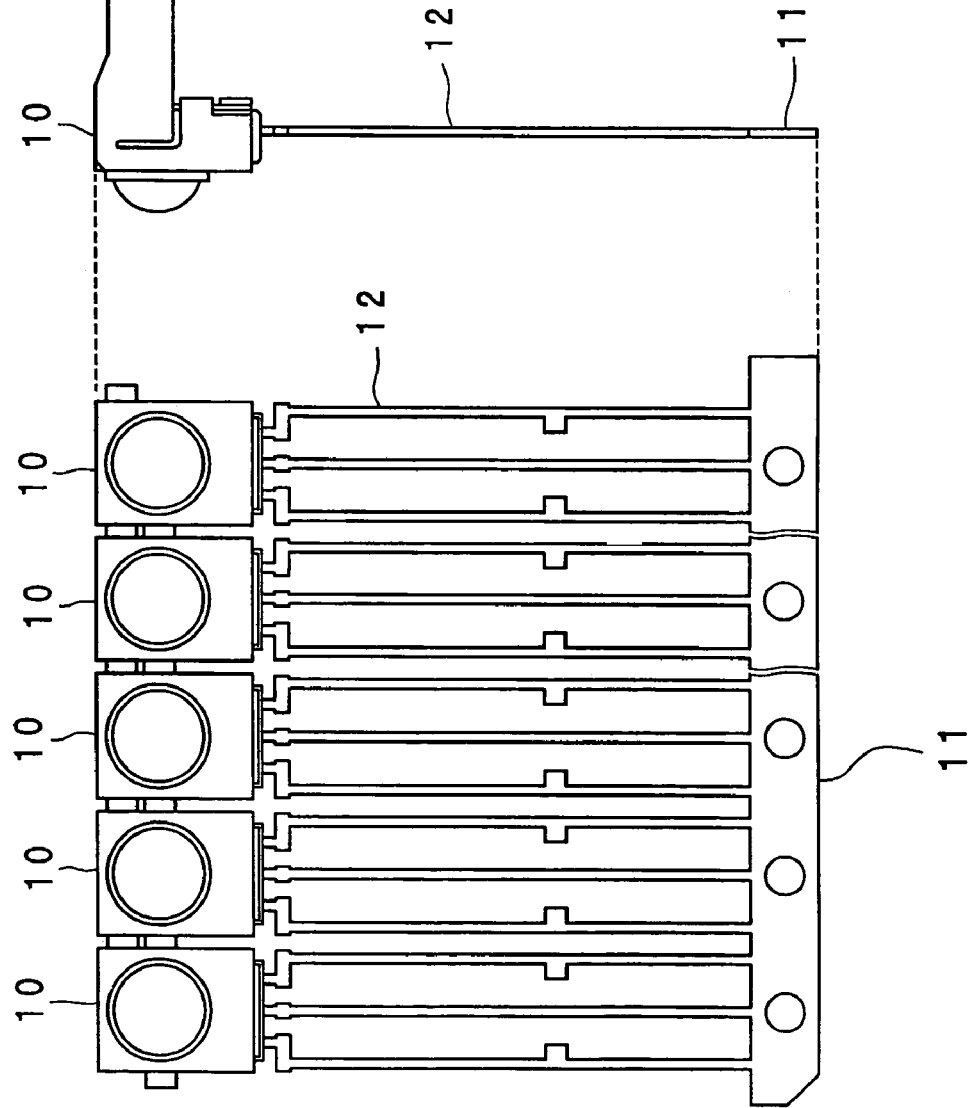
Fig. 10A PRIOR ART
Fig. 10B PRIOR ART

METHOD FOR MANUFACTURING SEMICONDUCTOR DEVICE HAVING SHIELDING CASE, ELECTRONIC EQUIPMENT USING THE SEMICONDUCTOR DEVICE, AND SHIELDING CASE ATTACHING METHOD

This nonprovisional application claims priority under 35 U.S.C. §119(a) on Patent Application No(s). 2003-373230 filed in Japan on Oct. 31, 2003, the entire contents of which are hereby incorporated by reference.

BACKGROUND OF THE INVENTION

1. Field of the Invention

The present invention relates to a semiconductor device having a shielding case on exterior thereof for prevention of influence of disturbance noise such as unwanted radiation noise (electromagnetic noise) and more particularly to a method for manufacturing such a semiconductor device, a method for fixing a shielding case, and electronic equipment having such a semiconductor device.

2. Description of the Related Art

As a semiconductor device of such a type as described above, there have been known photodetectors such as infrared remote control photodetector units and infrared communication devices (IRDA) that are used in household electric appliances, information communication devices (such as personal computers), and the like.

For example, in a receiver for remote control (which will be referred to as a "remote control photodetector unit") for receiving infrared light signal transmitted from a device for remote control called a "remote control transmitter" or the like, the infrared light signal transmitted from the remote control transmitter is received by a photodetector device (photodiode chip, which will be referred to as a "PD chip"). Then the received infrared light signal is subjected to various types of signal processing such as amplification and waveform shaping by a signal control processing device (which will be referred to as an "IC chip"), and various audio visual instruments such as TV and VTR and office automation instruments such as personal computer are remotely controlled in response to the received signal.

The infrared light signal transmitted from the remote control transmitter is digital signal, which is received by a light receiving surface of the PD chip, and the received light signal is converted into weak electric signal. The weak electric signal is amplified by a factor of tens of thousands by an amplifier in the IC chip, and only required signal frequencies are extracted from the amplified electric signal by a filter circuit (band-pass filter (BPF)) for extracting only signal in a required frequency band. After that, the signal is outputted as digital waveform information similar to the infrared light signal by a detector circuit.

Such a remote control photodetector unit is formed by placement and fixation of the PD chip and the IC chip onto a lead frame and by subsequent sealing with molding resin. Among remote control photodetector units, there are multi-chip photodetector components in which outside of the molding resin is covered with a metal case and multi-chip photodetector components in which inside of the molding resin is covered with a lead frame. In general, remote control photodetector units require a remote control distance of not less than 10 meters. In any multi-chip photodetector component, signal amplification processing by a factor of tens of thousands is carried out for amplifying weak electric signal. Accordingly, not only signals but also noise components such as electromagnetic noise are amplified by the amplifier, so that a ratio of signal to noise (S/N ratio) cannot be well ensured. As a result, it is made impossible to extract only required signals. In order to prevent such a phenomenon, electromagnetic shielding is widely used with a metal shielding case or the like covering the PD chip, the IC chip, and vicinity thereof, as described above.

In a single piece of a product, the metal shielding case for covering the molding resin only covers the molding resin and is not connected to a lead in a GND terminal part of the lead frame. Therefore, it is common that on the occasion of mounting the chip on a board, a user connects the metal shielding case to the GND lead part of the lead frame through a pattern on the board so as to be at the same potential. In the past, there was a product having in itself electrical continuity between the GND lead part and the metal shielding case. This structure, however, requires additional work such as establishment of the electrical continuity by soldering and therefore causes cost increase. Thus products having in itself no continuity are dominant among discrete products in each of which a metal shielding case is installed.

Hereinbelow, a structure of the remote control photodetector unit will be described in accordance with FIG. 7. Onto a metal lead frame 1 (which is made of iron in majority of cases and will be referred to simply as a "lead frame" below) in FIG. 7, a PD chip 2 is bonded with insulative adhesive 3 and an IC chip 4 is bonded with conducting adhesive 5. The PD chip 2 typically has a PN junction structure and a reverse voltage is applied thereto in the case of the remote control photodetector unit, so that a potential occurs in an N electrode on the back face side of the PD chip. Therefore, insulation has to be maintained between the PD chip 2 and a PD chip mounting part of the lead frame 1 that is to have a GND potential by structural reason, and epoxy resin containing insulative filler is used for bonding between the lead frame 1 and the PD chip 2.

By contrast, either the conducting adhesive 5 or the insulative adhesive 3 will do for bonding of the IC chip 4 onto the lead frame 1 because a back face of the IC chip 4, which carries out signal processing at a front face side thereof, has nothing to do with signal processing. Typically used is conducting adhesive 5 (such as an adhesive in which Ag powder is mixed with epoxy resin) that is excellent in workability and that has a sufficient adhesive strength. An electrode part 6 of the IC chip 4 and an input/output lead part 7 of the lead frame 1 are connected to each other through a gold wire 8 (hereinbelow, referred to also as an "Au wire") having a diameter of tens of micrometers. Similarly, connections through gold wires are provided between the PD chip 2 and an input/output lead part 7, between the IC chip 4 and other input/output lead parts 7, and between the PD chip 2 and the IC chip 4.

As shown in FIG. 8, the PD chip 2 and the IC chip 4 installed on the lead frame 1 as described above are sealed to be enclosed with thermosetting resin 9 (hereinbelow, referred to as a "mold sealing resin") containing a dye allowing infrared rays to pass therethrough and blocking visible radiation. The lead frame 1 exposed from the mold sealing resin 9 is subjected to resin deburring, tie bar cutting, lead cutting, and soldering. Thus the input/output lead parts 7 of the lead frame 1 are separated so as to form individual input/output leads 12.

For the resin molded article having undergone soldering as described above, a casing process with use of the metal shielding case is carried out as follows (see JP 07-245420 A and JP 2000-236102 A, for example). As shown in FIGS. 9A and 9B, a multiplicity of resin molded articles are connected by a guide frame 11. In this state, as shown in FIGS. 10A and 10B, discrete metal shielding cases 10 are put on over the corresponding resin molded articles and are fixed by "crimping." In this manner, the mold sealing resin 9 is surrounded by the metal shielding case 10 so that resistance to electromagnetic noise is ensured. Finally, the guide frame 11 is cut and thus a discrete article state is attained as shown in FIGS. 11A through 11C.

For production of electronic components, accommodation to automatic manufacturing equipment and overseas development of production have become typical with efficient production of the remote control photodetector units. The method of casing with the metal shielding cases for the remote control photodetector units (the method for fixing the shielding cases 10 to the resin molded articles in FIGS. 10A and 10B), however, is inefficient in that separate shielding cases 10 are mounted on each of the multi-connected resin molded articles, as described above. For more efficient production of the remote control photodetector units, accordingly, establishment of an efficient casing method with the metal shielding cases is required.

SUMMARY OF THE INVENTION

An object of the present invention is to provide a method for manufacturing semiconductor devices with efficient casing of a bank of resin molded articles constituting semiconductor devices using shielding cases, electronic equipment using the semiconductor device, and a shielding case attaching method which can be employed in the manufacturing method.

In order to accomplish the above object, the present invention provides a method for manufacturing a semiconductor device in which a molded article having a semiconductor chip sealed with resin is covered with a shielding case, comprising:

preparing a molded article bank in which a plurality of said molded articles are connected in parallel by a guide frame;

preparing a shielding case bank in which a plurality of shielding cases are connected in parallel by a guide frame;

overlaying the shielding case bank on the molded article bank in such a manner that the shielding cases each cover a corresponding one of the molded articles; and dividing the molded article bank covered with the shielding case bank into discrete articles.

With the construction described above, casing of the molded articles in the molded article bank can be performed at a time with use of a shielding case bank in which a plurality of shielding cases are connected in parallel by a guide frame. Accordingly, the efficiency of casing the molded articles with shielding cases can significantly be increased in comparison with the conventional casing method in which molded articles in a molded article bank are covered with separate or discrete shielding cases one by one.

An example of the semiconductor device is a photodetector in which the semiconductor chip is a photodetector element for converting received light into electric signal.

In accordance with the invention, production efficiency can be increased while ease of use of the photodetector on user side is maintained.

In one embodiment, a pitch at which the shielding cases are arranged in the shielding case bank is n (n: a positive integer) times as large as a pitch at which the molded articles are arranged in the molded article bank, and the overlaying the shielding case bank on the molded article bank comprises putting n shielding case banks one on top of another in an overlapping manner such that the shielding cases of the n banks are arranged as a whole at a same pitch as the pitch of the molded articles in the molded article bank.

In accordance with the embodiment, casing of the molded article bank with the shielding cases can be performed at a time even if the pitch at which the shielding cases are arranged in the shielding case bank is as large as the pitch at which the molded articles are arranged in the molded article bank because of a large developed area of each shielding case.

In one embodiment, the shielding cases and the guide frame in the shielding case bank are formed of an identical plate material, and the shielding cases and the guide frame are connected through corresponding plate-like joints protruding from one side of the guide frame at specified intervals.

In accordance with the embodiment, the shielding case bank can easily be formed of one metallic plate by subjecting the plate to stamping and bending by a progressive scheme.

In one embodiment, the joints are contiguous on one side of front faces of the shielding cases.

In accordance with the embodiment, the guide frame, the joints, and the shielding cases in the shielding case bank can easily be formed from one sheet of metallic plate material.

In one embodiment, each joint is provided with a separator for separating the associated shielding case from the guide frame, at a boundary between the shielding case and the joint.

In accordance with the embodiment, after the shielding case bank is overlaid on the molded article bank so that each shielding case covers the corresponding molded article of the molded article bank, the shielding cases are separated from the joints. Thus separation into individual molded articles is easily carried out.

In one embodiment, the separator comprises a groove extending from one side to the other side of the joint, and the separation of each shielding case from the guide frame is achieved by bending the guide frame relative to the shielding case around the groove serving as a fulcrum.

In accordance with the embodiment, the separation of the shielding cases at the border thereof with the joints can easily be achieved by bending of the guide frame relative to the shielding cases.

According to one embodiment, the groove is formed on a surface of the joint that continues from the front face of the associated shielding case. Therefore, when separating the shielding cases, bending the guide frame toward the front faces of the shielding cases would prevent burrs on a cut surface.

In one embodiment, when the overlapping n shielding case banks are overlaid on the molded article bank and surfaces of the molded articles are brought into close contact with back faces of the shielding cases, possible strain in the molded articles caused by a difference in level between the shielding case banks is absorbed by flexure of leads that connect molded parts of the molded articles to the guide frame.

In accordance with the embodiment, when the overlapping n shielding case banks are overlaid on the molded article bank so that the surfaces of the molded articles are brought into close contact with the back faces of the shielding cases, unwanted stresses are prevented from being exerted on the molded parts of the molded articles and the guide frame.

In one embodiment, when the overlapping n shielding case banks are overlaid on the molded article bank and front faces of the shielding cases are made flush with each other, possible strain caused on borders between joints and the shielding cases is absorbed by deformation at locations of separation of the guide frame.

In accordance with the embodiment, unwanted stresses are prevented from being exerted on the molded parts and the guide frame when fixing the shielding cases to the molded articles by "crimping" or the like after the overlapping n shielding case banks have been overlaid on the molded article bank. Thus the front surfaces of the molded articles are brought into close contact with the back faces of the shielding cases.

In one embodiment, the guide frame of each shielding case bank has holes corresponding to the shielding cases, and the method includes pushing the guide frame of one of two adjacent shielding case banks by ejector pins extending through the holes of the guide frame of the other of the two adjacent shielding case banks so as to bend the guide frame of the one of the two adjacent shielding case from boundaries between the shielding cases and the guide frame for cutting of the guide frame.

In accordance with the embodiment, when cutting the guide frames of the shielding case banks after the n shielding case banks are overlaid on the molded article bank, the ejector pins extending through the holes in one guide frame push and bend the adjacent guide frame. Thus, the guide frame is easily cut off.

In one embodiment, upon overlaying the overlapping n shielding case banks on the molded article bank, each hole provided in the guide frame of each shielding case bank is placed between leads connecting a molded part of the molded article and the guide frame of the molded article bank.

In accordance with the embodiment, with the n shielding case banks overlaid on the molded article bank, the ejector pins are allowed to pass through the holes in the guide frame without being encumbered by the leads of the molded articles.

In one embodiment, the holes provided in the guide frames of the shielding case banks double as feeding holes that are used when the shielding case banks are manufactured.

In accordance with the embodiment, it is unnecessary to separately provide the feeding holes for use during the manufacturing process of the shielding case banks, and hence it is unnecessary to provide a guide frame for formation of such feeding holes. Thus necessity is eliminated for a process of cutting off the guide frame having the feeding holes, which process would be necessary if a guide frame having feeding holes is additionally used. Consequently, manufacturing of the shielding case bank is prevented from being complicated.

Electronic equipment according to the present invention has a semiconductor device manufactured by the method of the invention.

In accordance with the configuration described above, electronic equipment can use semiconductor devices formed by the manufacturing method that has an extremely high efficiency of casing of molded articles with shielding cases. Thus, the electronic equipment is obtainable inexpensively and efficiently.

Among the electronic equipment are optical space transmission data communication equipment for OA equipment, portable terminals, portable telephones, personal computers, and the like, infrared remote control photodetector devices for household electric appliance, AV equipment, and the like, optical fiber link, range finding sensor, and human body detection sensor.

The present invention also provides a shielding case attaching method, comprising:

preparing a molded article bank in which a plurality of molded articles are connected in parallel by a guide frame, each of said molded articles having a semiconductor chip sealed with resin;

preparing a shielding case bank in which a plurality of shielding cases are connected in parallel by a guide frame; and overlaying the shielding case bank on the molded article bank in such a manner that the shielding cases each cover a corresponding one of the molded articles.

As compared with the conventional casing method in which molded articles in a molded article bank are covered with separate or discrete shielding cases one by one, the shielding case attaching method of the invention remarkably improves the efficiency of casing the molded article bank. Thus, it is advantageous to use this method in manufacturing a semiconductor device covered with a shielding case.

It goes without saying that the invention can be applied not only to photodetector devices but in general to semiconductor devices requiring a shielding case to be fixed thereto.

Other objects, features and advantages of the present invention will be apparent from the following description.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein:

FIGS. 9A and 9B are a front view and a side view, respectively, showing a resin molded article bank;

FIGS. 10A and 10B are a front view and a side view, respectively, showing a state in which shielding cases made of metal have been put on and fixed to the individual resin molded articles of FIGS. 9A and 9B.

DETAILED DESCRIPTION OF THE INVENTION

Figure 1:
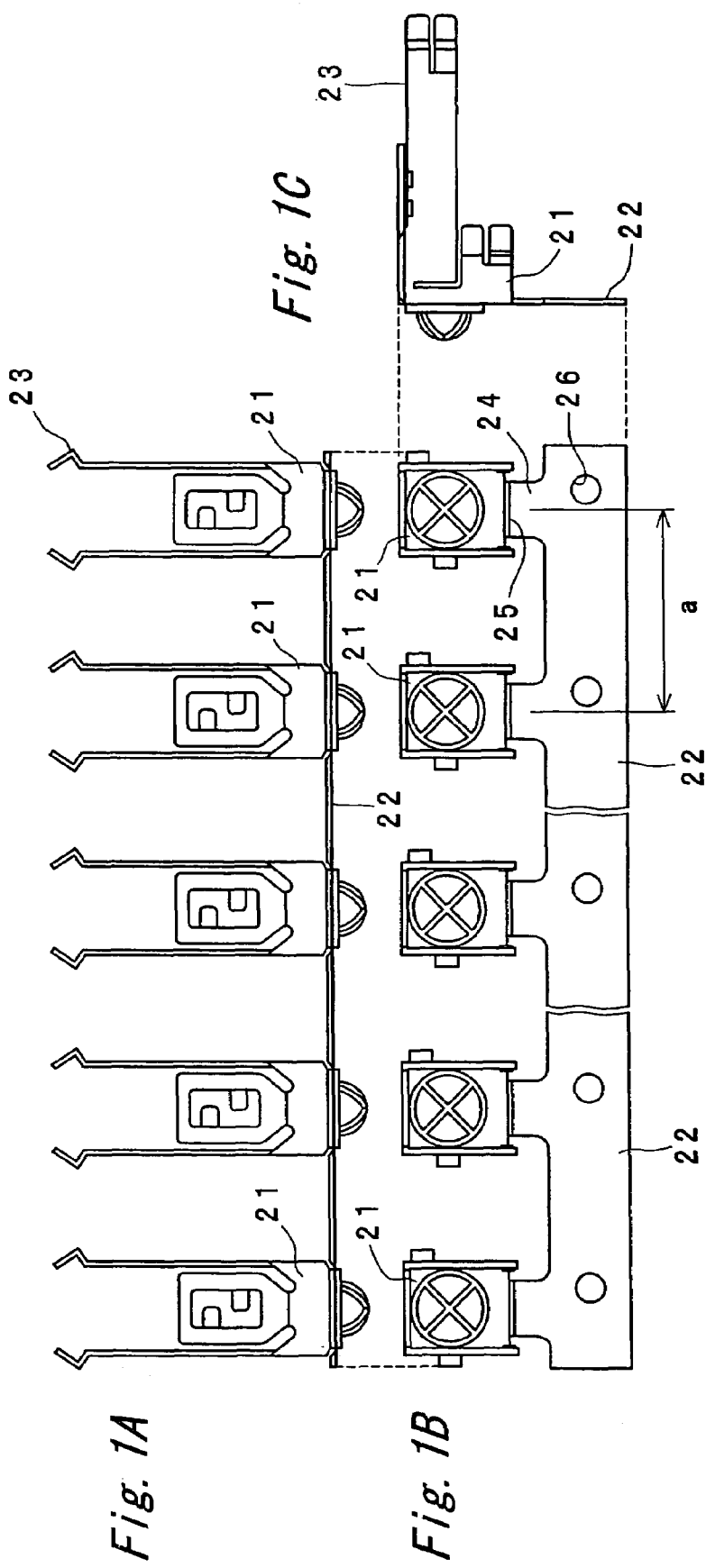
FIGS. 1A, 1B, and 1C are a plan view, a front view, and a side view, respectively, of a shielding case bank that is used in a method of manufacturing a semiconductor device of the invention.
Figure 3:
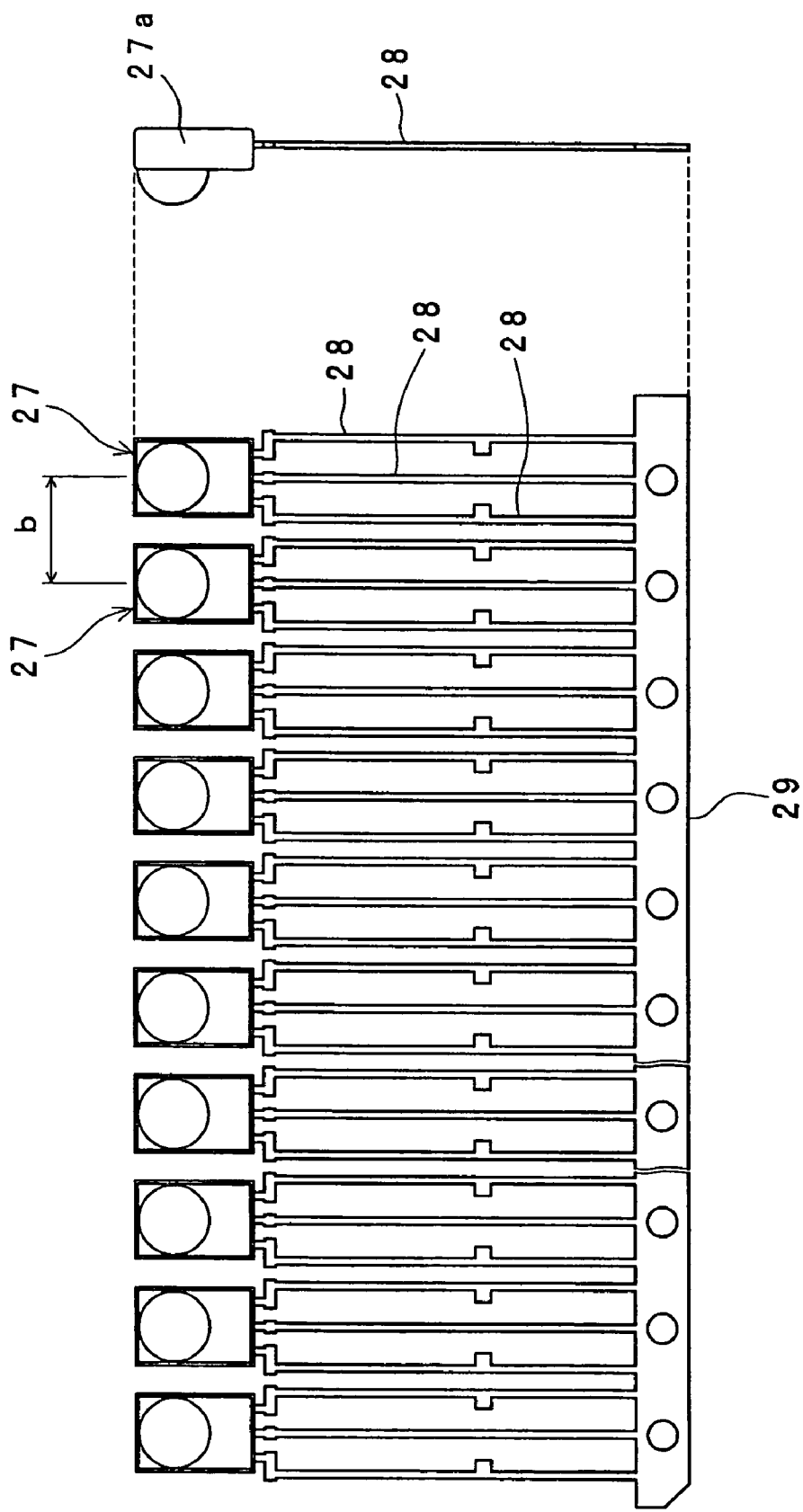
FIGS. 3A and 3B are a front view and a side view, respectively, of a molded article bank.

Hereinbelow, the invention will be described in detail with reference to embodiments shown in the accompanying drawings. In the following description, manufacture of a remote control photodetector unit as a semiconductor apparatus will be taken up as an example. An internal structure of a molded article, however, has already been described in the BACKGROUND OF THE INVENTION section and will be omitted. FIGS. 1A, 1B, and 1C are a plan view, a front view, and a side view, respectively, of a shielding case bank that is used in the manufacturing method of the embodiment. FIGS. 3A and 3B are a front view and a side view, respectively, of a molded article bank.

In FIGS. 1A through 1C, reference numeral 21 denotes shielding cases, and a plurality of shielding cases 21 are connected through a guide frame 22. A pitch, a, between the adjacent shielding cases 21 is twice as large as a pitch, b, between molded packages of molded articles 27 in a molded article bank (see FIG. 3A). That is, the shielding cases 21 are provided at intervals as large as those of every other molded article 27 in the molded article bank. Reasons why the pitch, a, between the shielding cases 21 is twice as large as the pitch, b, between the molded packages are as follows.

A first reason why the shielding case is required for the remote control photodetector unit is that the shielding case surrounds the molded article 27 and functions as electromagnetic shielding material. For that purpose, the shielding case is required to cover a front face, both side faces, a back face, and a top face of the molded article 27. A bottom face thereof cannot be shielded because input/output leads 28 protrude from the bottom face. Also, a photodetecting part of the front face, which receives light signal, cannot fully be shielded.

A second reason why the shielding case is required is that autonomy is required when a user carries out mounting on a board and that the remote control photodetector unit therefore requires hooks so as not to float or come off from the board when mounted on the board. Crank-like hooks 23 are provided in each shielding case 21 in the shielding case bank of the embodiment.

A third reason why the shielding case is required is that the remote control photodetector unit having a purpose of receiving remote control signal is typically provided on a front face of a product such as a television set and that heights of the photodetector unit relative to mounting boards and directions of rays to be received vary according to users. In order to cope with that fact, there are required various remote control photodetector units of which heights relative to mounting boards and directions of reception of rays are various. Accordingly, the molded articles need to be shielded even at both side faces and the back face as well.

For the above reasons, the shielding case shields the front face, both the side faces, the back face, and the top face of the molded article 27 and is provided with the hooks 23. Therefore, a developed area of the single shielding case 21 is increased and a developed size thereof in a direction of the pitch is also increased. In the molded article 27, by contrast, electronic components have only to be installed onto a planar lead frame from one direction, and making the molded packages is executed by a transfer molding method in which sealing of the electronic components with resin is performed with the lead frame enclosed by upper and lower molding dies. Therefore, a clearance between the molded articles 27 may be small. The clearance between the molded articles 27 in consideration of a constraint on the molding dies is on the order of 0.5 mm. The clearance between the molded articles 27, however, may be constrained by the structures and production processes thereof, a pitch of input/output leads 28, or the like, but the constraint, if any, is typically smaller than the constraint of the developed size of the single shielding case 21 in the direction of the pitch.

In consideration of above, the shielding cases 21 in the shielding case bank are provided at the intervals corresponding to the intervals of every other molded article 27 in the molded article bank. Depending on the developed size of the single shielding case 21 in the direction of the pitch, it may be difficult to provide the shielding cases 21 at the intervals of every other molded article 27. In that case, the shielding cases 21 are provided at intervals of every three molded articles 27 or the like. Accordingly, the pitch of the shielding cases 21 in the shielding case bank is n (a positive integer) times as large as the pitch of the molded articles 27 in the molded article bank. Provided that the pitch between the molded articles 27 is equal to or larger than the developed size of the single shielding case 21 in the direction of the pitch, the pitch of the shielding cases 21 in the shielding case bank is set to be same as the pitch of the molded articles 27.

Hereinbelow, a connection structure between the shielding cases 21 and the guide frame 22 will be described. In the manufacturing process, the shielding cases 21 and the guide frame 22 are integrally formed through medium of joints 24 protruding from one side of the guide frame 22 and arranged at a pitch as large as the pitch of the shielding cases 21. The joints 24 have a width generally equal to a width of the single shielding case 21 in order to prevent misalignment or decentering of the shielding cases 21 in a direction of arrangement thereof. Provided that the width of the joints is small, the shielding cases 21 are prone to be misaligned and are thus difficult to install on the molded article bank.

V notches 25 having a section shaped like a letter "V" are provided in vicinity of borders between the joints 24 and the shielding cases 21 so that the shielding cases 21 can accurately and easily be separated into a discrete state. Provided that a thickness of the shielding cases 21 (that is, a thickness of the joints 24) is 0.3 mm, the V notches 25 may suitably have a depth in a range of from 0.15 mm to 0.2 mm. Too small a depth of the V notches 25 requires the shielding cases 21 to be bent back and forth many times for the separation of the shielding cases 21 from the joints 24 and thus involves much trouble. On the other hand, too large a depth of the V notches 25 may cause the shielding cases 21 to be unexpectedly separated from the joints 24.

The depth of the V notches 25 can be verified by observation of sections of separation surfaces of the shielding cases 21 after separated into the discrete state. The V notches 25 are provided at the joints 24 on front face side of the product. In separating the shielding cases 21 from each other, the guide frame 22 is bent toward the front face side of the product, or shielding case bank (that is, in a direction such that widths of the V notches 25 are decreased and that the V notches 25 are crushed). That is intended for preventing burrs from occurring as cut traces. It does not matter functionally if surfaces of the joints 24 on which the V notches 25 are formed are on back face side of the products.

Other than the V notches 25, holes and the like are conceivable as means which are provided in the joints 24 in order that the shielding cases 21 may accurately and easily be separated into the discrete state.

Hereinbelow, holes 26 provided in the guide frame 22 will be described. The holes 26 provided in the guide frame 22 are provided in one to one correspondence with each of the shielding cases 21 and are deviated by 1.27 mm from centers of the shielding cases 21 in a direction of the pitch of the shielding cases 21.

There are two reasons why the holes 26 are provided in the guide frame 22. The first reason is that in manufacturing the shielding case banks, the holes 26 are used for positioning for stable feeding of the products without displacement in a so-called progressive cutting process in which the products are sequentially fed and cut. The second reason is that the holes 26 are used for separation of overlapping two guide frames 22 as follows. That is, two shielding case banks, in which the shielding cases 21 have been formed at the intervals of every other molded article 27, are laid one on the other in a shifted or displaced manner relative to each other by half the pitch (corresponding to one pitch of the molded articles) and then the casing process is performed, as will be described in detail. After that, the guide frames 22 are cut one by one. When cutting the guide frames 22, ejector pins (that will be described in detail later) are inserted into the holes 26 of one of the overlapping guide frames 22 to extrude the other guide frame 22 so that the overlapping two guide frames 22 are thereby separated from each other.

In the three input/output leads 28 each molded article 27 has, outside input/output leads 28 are formed at a distance of 2.54 mm from the center of the product (molded article). Therefore, the centers of the holes 26 are deviated from the centers of the shielding cases 21 in order that the holes 26 may be placed in positions which interfere with neither the outside input/output leads 28 nor the input/output leads 28 positioned at the centers of the products (shielding cases). Accordingly, a different amount of the displacement of the outside input/output leads 28 from the center of the product necessitates a different amount of the deviation of the holes 26 of the guide frame 22 from the centers of the products (shielding cases).

Hereinbelow will be described a method of manufacturing the shielding case bank with the above configuration. In the manufacture of the shielding case bank, stamping and bending of a metal plate wound like a reel are performed over a plurality of steps in a progressive method to thereby shape the shielding cases 21.

In this process, the shielding cases 21 flowing through the steps by progression are connected by the guide frame 22 in which the holes 26 for positioning have been provided. In this manner, the shielding cases 21 flow to a final step without being separated from each other. In the final step, conventionally, the single articles were obtained by cutting. In the embodiment, however, shielding case banks are obtained by cutting in accordance with a length of the molded article bank that is a bank of molded articles connected to each other by the guide frame 29 as shown in FIG. 3A.

In the embodiment, the guide frame that is used in the manufacture of the shielding case bank is also used as the guide frame 22 for the casing of the molded article bank with the shielding case bank. Both the guide frames, however, may be provided separately, depending on constraints on the manufacture and structure of the shielding case bank or the like.

Hereinbelow will be described a method of the casing with use of the shielding case banks that have been formed as described above and that have the above configuration. Herein, the term "casing" refers to a process of fitting and fixing (crimping) a shielding case onto a molded article.

Figure 2:
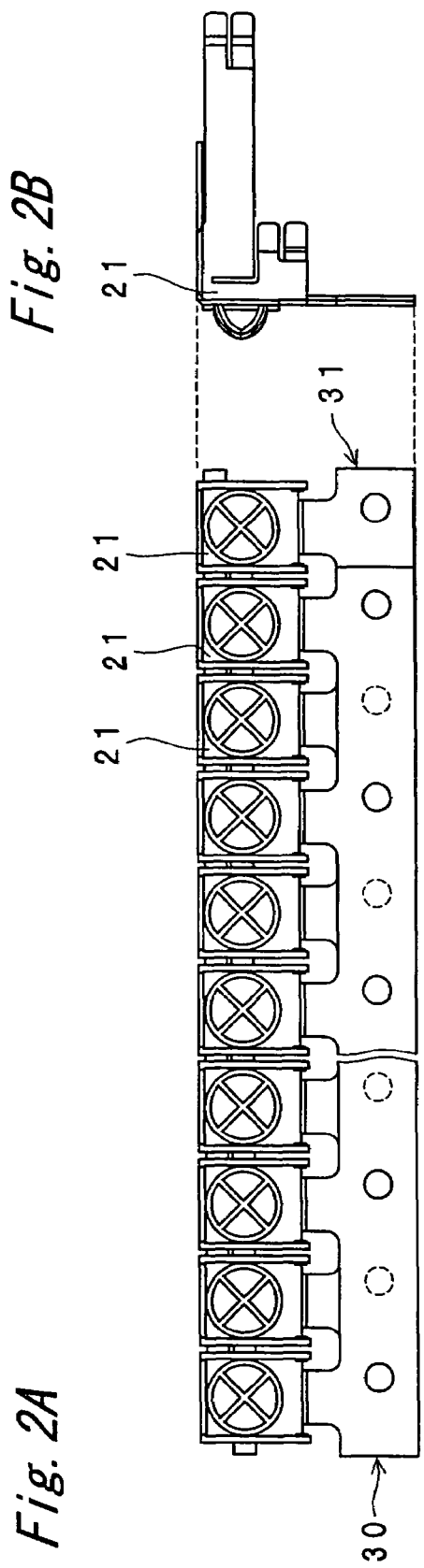
FIGS. 2A and 2B are a front view and a side view, respectively, showing a state in which two shielding case banks are laid one on the other.

As described above, the two shielding case banks, in each of which 20 pieces 21 are connected at intervals of every other molded article 27 of the molded article bank, overlap with each other in a displaced manner from each other by half the pitch as shown in FIG. 2A, and thus a composite shielding case is formed in which 40 pieces 21 are connected in parallel at the same pitch as that of the molded articles 27 shown in FIG. 3A.

Figure 4:
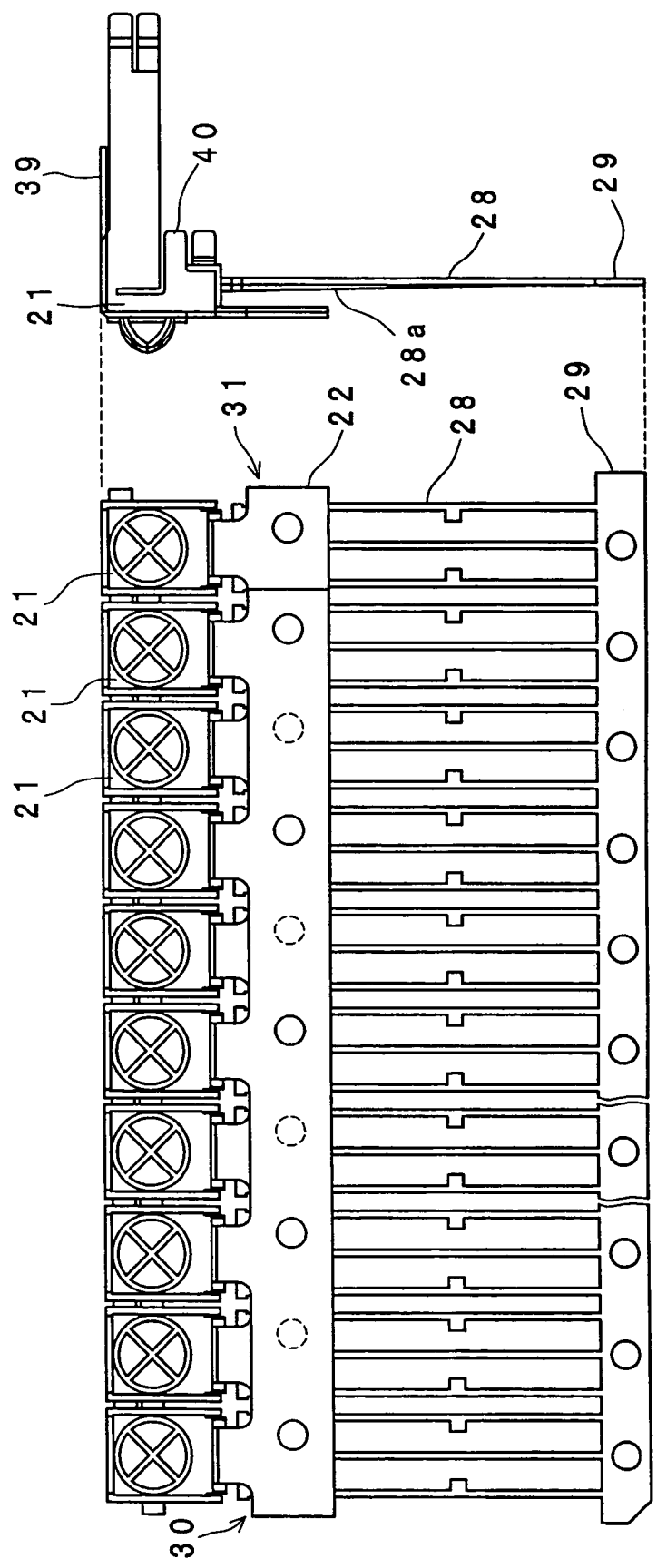
FIGS. 4A and 4B are a front view and a side view, respectively, showing a state in which the overlapping two shielding case banks have been mounted on the molded article bank.

As shown in FIGS. 4A and 4B, two shielding case banks 30 and 31 stacked in an overlapping manner are mounted on the molded article bank having 40 molded articles 27 connected. Then the front face, both the side faces, and the top face of each molded article 27 are covered with a corresponding single shielding case 21.

Subsequently, as shown in FIGS. 4A and 4B, a casing apparatus (not shown) bends back covers 39 of the shielding cases inward (in this case, toward the guide frame 29 in a direction in which the input/output leads 28 extend), and bends inward crimping hooks 40 that are connected to both side faces of the shielding cases 21 to thereby crimp the hooks on the back covers 39 of the cases (holds the back covers). Thus the back faces of the molded articles 27 are covered, and the molded articles 27 and the shielding cases 21 are fixed to each other. In this process, the steps of from the bending of the back covers 39 of the shielding cases to the crimping with the crimping hooks 40 are performed by the casing apparatus, and the overlap of the two shielding case bank 30, 31 causes a difference in level corresponding to the thickness (0.3 mm) of the shielding case 21, between surfaces of the adjacent shielding cases 21 and between surfaces of the adjacent joints 24. Therefore, for every other molded article 27 a difference in level of 0.3 mm needs to be provided in a shielding case/molded article loading part in the casing apparatus or on casing blades of the casing apparatus. Though the thickness of the shielding case 21 is 0.3 mm in the above description, it does not matter at all whether the thickness is smaller or larger. Herein, the "casing blades" are members that are provided in the casing apparatus and that are intended for crimping the crimping hooks 40 provided in the shielding case banks 30, 31.

The provision of the difference in level in the shielding case/molded article loading part or on the side of the casing blades in the casing apparatus, however, causes following problems. The first problem is complexity of a structure of the casing blades in the casing apparatus. The second problem is an operational problem. That is, reversal of a direction of the overlap of the two shielding case banks 30 and 31 might produce a frame in which too tight holding by 0.3 mm might cause mold cracks at worst and a frame in which too loose holding by 0.3 mm might result in insufficient "crimping." Herein, the term "frame" refers to a composite component of the shielding case banks 30, 31 and of the molded article bank that has undergone the casing process by the casing apparatus.

In the embodiment, therefore, the difference in level is provided neither in the shielding case/molded article loading part nor on the side of the casing blades in the casing apparatus, and possible strain caused in the molded articles 27 by the difference in level of 0.3 mm of the surfaces of the shielding cases 21 and the joints 24 is absorbed by the following methods.

In the case of FIGS. 4A and 4B, for example, the strain caused by the difference in level of 0.3 mm between the shielding cases 21 of the shielding case bank 30 in an upper position and the shielding cases 21 of the shielding case bank 31 in a lower position is absorbed by flexure of input/output leads 28a that link molded parts 27a (see FIG. 3B) of the molded articles 27 covered with the shielding cases 21 of the shielding case bank 30 in the upper position and the guide frame 29. On condition that lengths of the input/output leads 28 are not smaller than 20 mm, when the input/output leads 28 are flexed, unwanted stresses are not exerted on portions of the molded parts 27a to which the input/output leads 28 are fixed.

Figure 5:
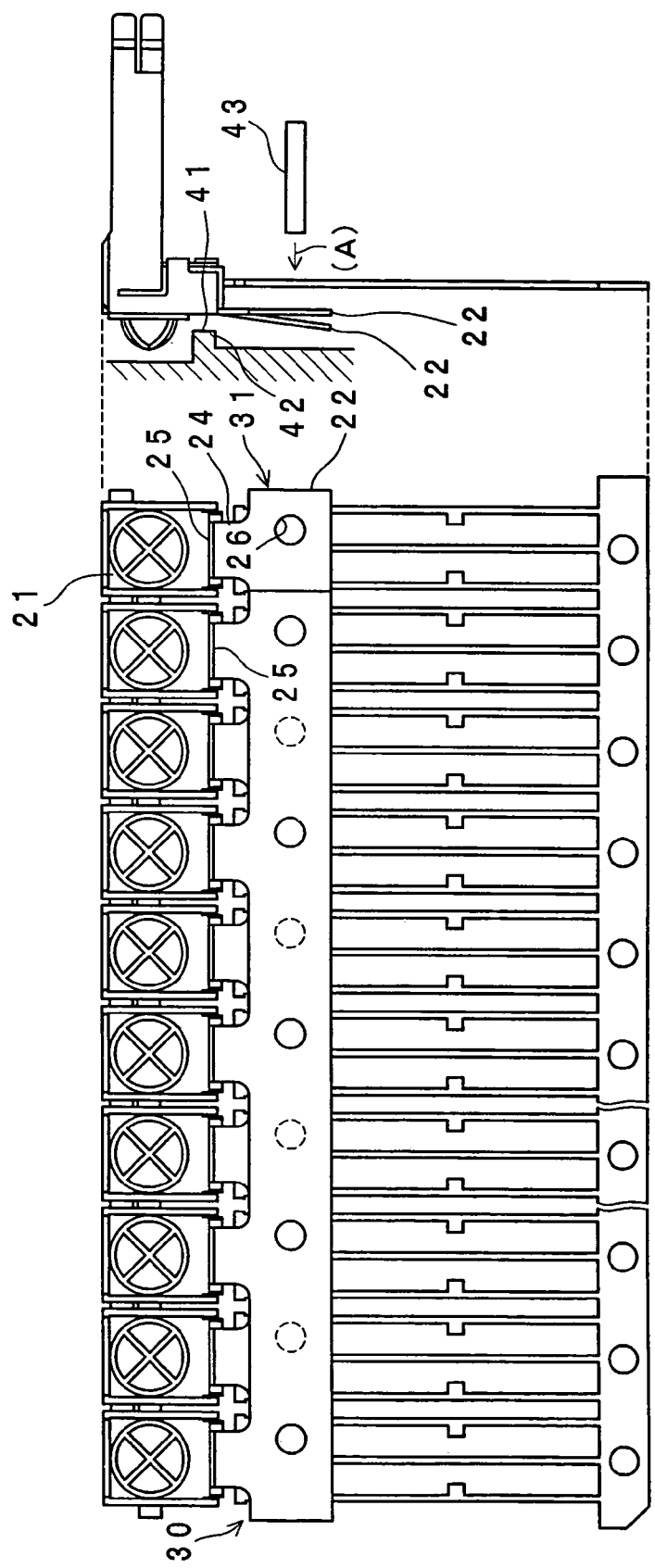
FIGS. 5A and 5B are a front view and a side view, respectively, showing how to separate a guide frame from one of the overlapping two shielding case banks.

Alternatively, as shown in FIGS. 5A and 5B, the shielding cases 21 of the two shielding case bank 30 and 31 may be attached to the molded articles by the casing process on one flat surface 41 of the casing apparatus, as will be described in detail later. In this process, the guide frames 22 of the shielding case banks 30 and 31 interfere with each other. However, the flat surface 41 of the casing apparatus is provided with a difference 42 in level of not smaller than the thickness (0.3 mm) of the shielding cases 21 in a position on the shielding case 21 side of the boundaries (position of the V notches 25) between the shielding cases 21 and the joints 24. In this configuration, surfaces of all the shielding cases 21 are fixed in the same plane by the flat surface 41 of the casing apparatus on the occasion of "crimping," while the joints 24 of the shielding case bank 30 in the upper position are bent with the V notches 25 acting as fulcra (which relieves the mutual interference between the guide frames 22). That is why unwanted stresses are not exerted on the shielding cases 21 of the shielding case bank 30 in the upper position.

Thus, a method of attaching the shielding case banks without stresses exerted on the shielding cases 21 or the molded parts 27a to be fixed thereto is achieved even if the casing apparatus is not provided with a difference in level, or stepped portion at the shielding case/molded article loading part or the casing blade.

Subsequently, the guide frames 22 connected to the shielding cases 21 are cut as follows. As shown in FIGS. 5A and 5B, initially, the ejector pins 43 are thrust out in a direction of arrow (A) through the holes 26 of the shielding case bank 31 residing in the lower position so that the guide frame 22 of the shielding case bank 30 in the upper position is thereby pushed and bent, and a gap is thus produced between this guide frame 22 and the other guide frame 22 of the shielding case bank 31 in the lower position. After that, the guide frame 22 pushed and bent by the ejector pins 43 is pinched by jigs (not shown) and is bent back and forth several times (once or twice on condition that the depth of the V notches 25 is 0.2 mm) with use of the V notches 25 as fulcra. By this operation, the guide frame 22 of the shielding case bank 30 in the upper position is cut off and separated from the associated shielding cases 21. Subsequently, the guide frame 22 of the shielding case bank 31 in the lower position is pinched by the jigs and is separated from the associated shielding cases 21 in the same manner as above. Thus the two combined guide frames 22, 22 are separated one by one from the associated shielding cases 21.

Figure 6:
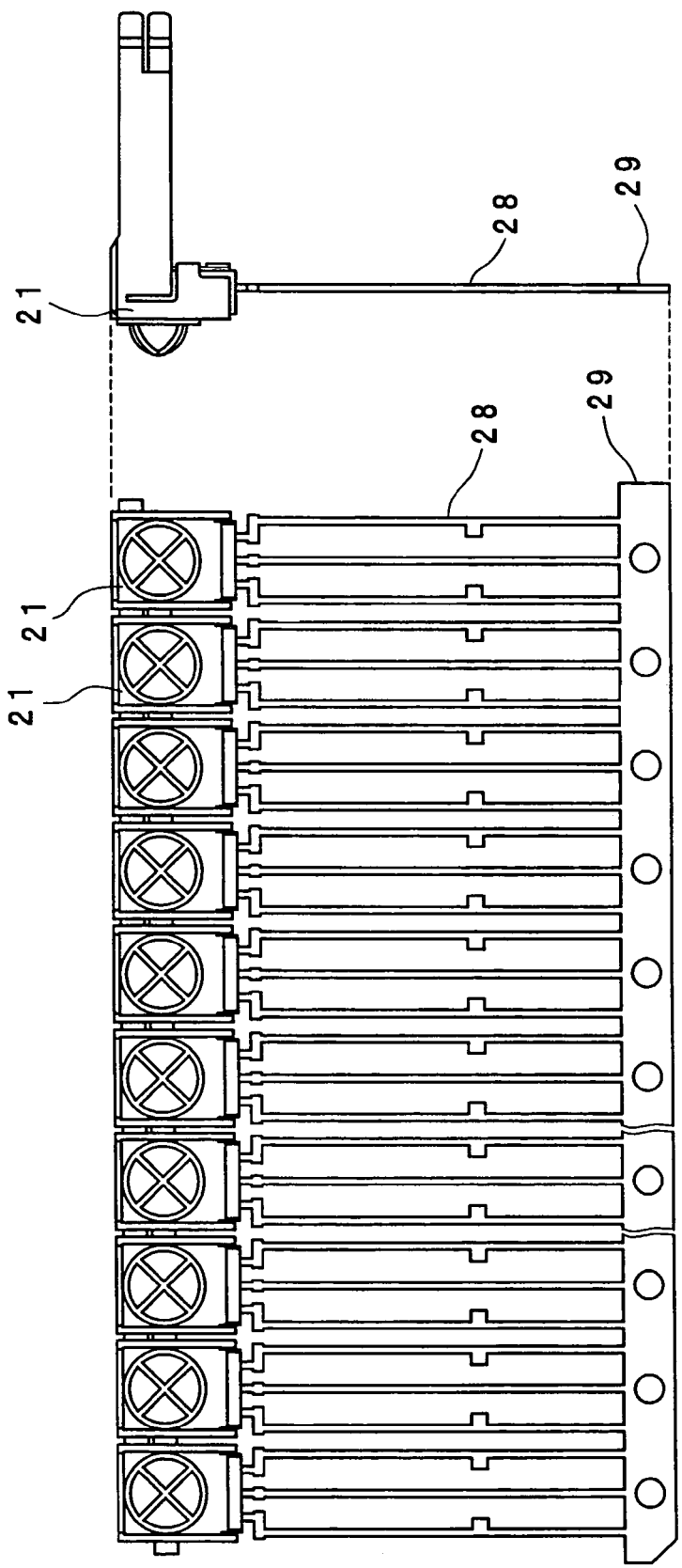
FIGS. 6A and 6B are diagrams showing the molded article bank in which individual molded articles have been covered with shielding cases.
Figure 7:
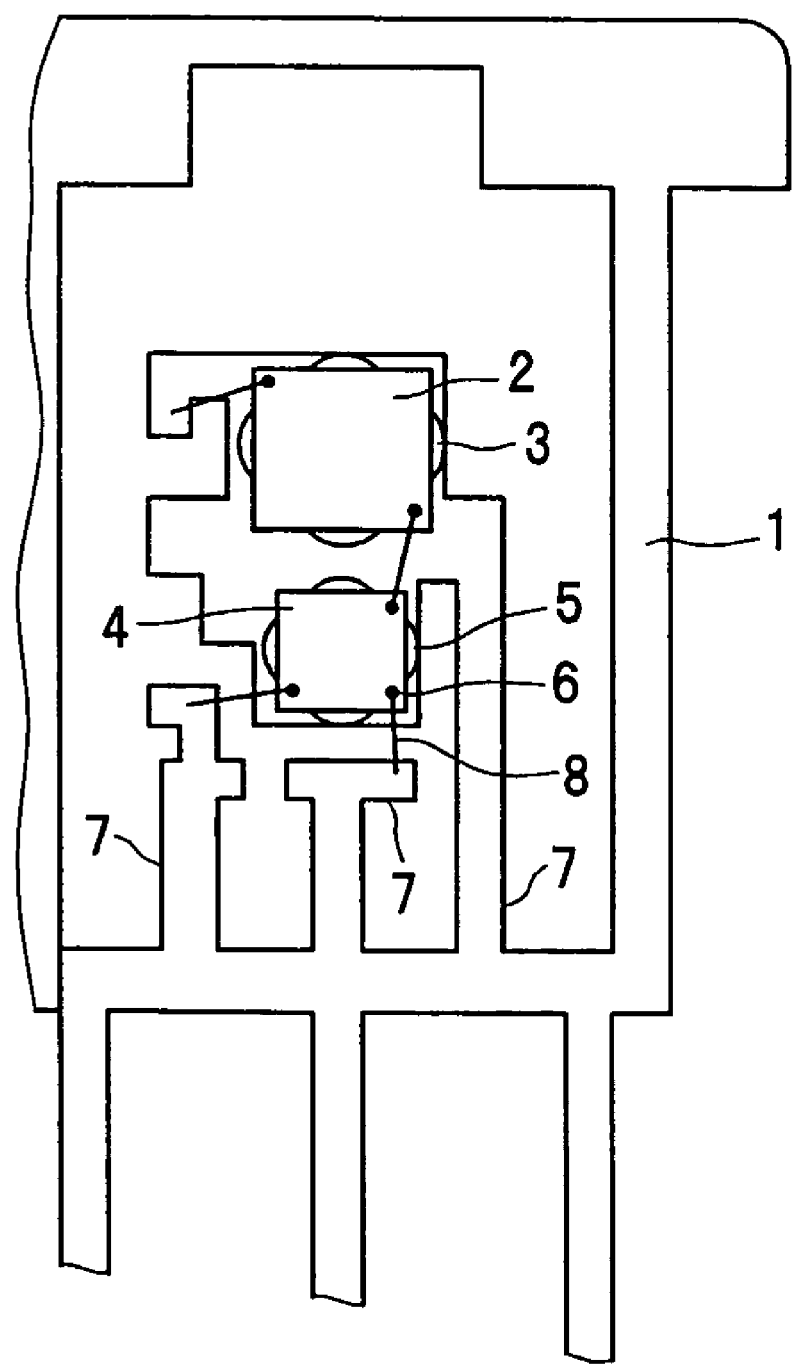
FIG. 7 is a diagram showing a state in which a PD chip and an IC chip have been mounted on a lead frame.
Figure 8:
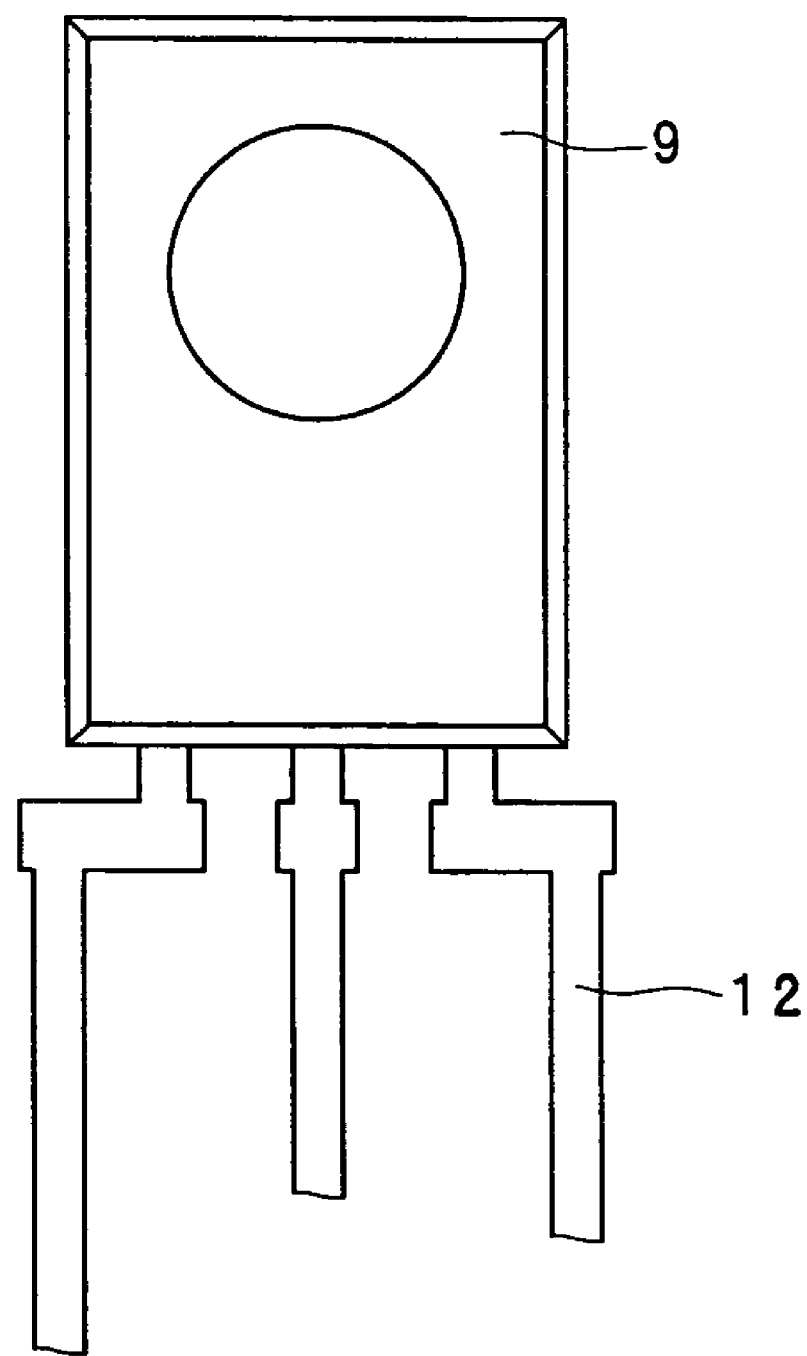
FIG. 8 is a diagram showing a state in which the PD chip and the IC chip mounted on the lead frame have been sealed with molded sealing resin.
Figures 11A, 11B, 11C:
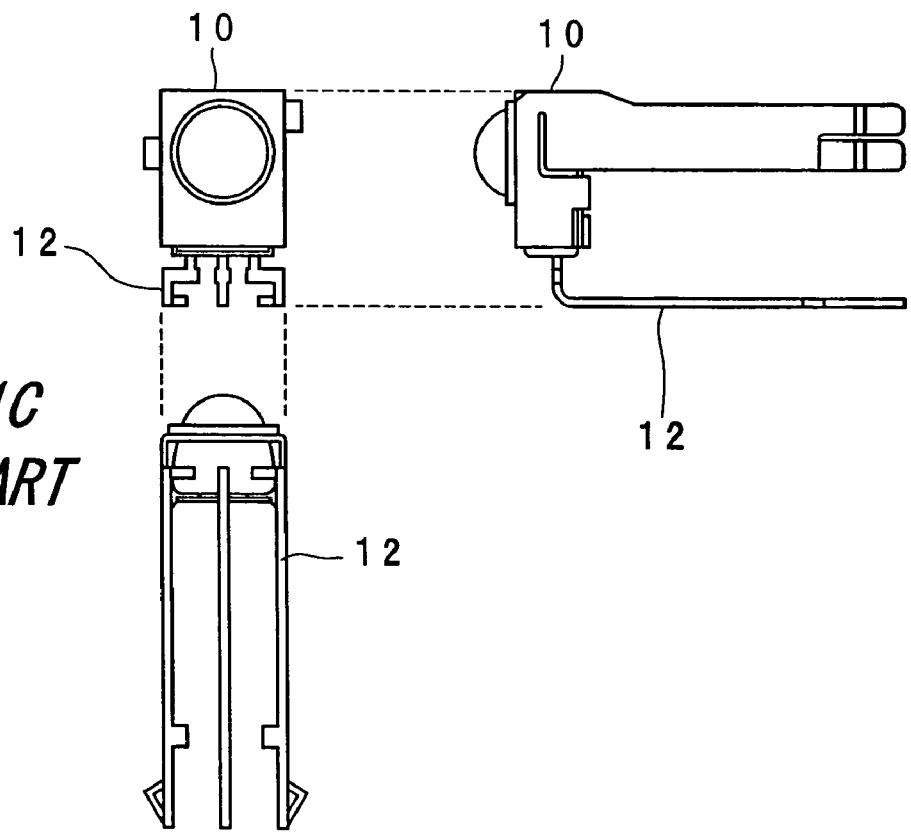
FIGS. 11A, 11B, and 11C are a front view, a side view, and a bottom view, respectively, showing a state in which a guide frame shown in FIGS. 10A and 10B has been cut off, so that the articles have been separated from each other.

In this way, the casing process with use of the shielding case banks is completed. Consequently, as shown in FIGS. 6A and 6B, a molded article bank is obtained which has 40 molded articles 27 each covered with the respective shielding cases 21 and connected together by the guide frame 29. After that, the guide frame 29 is cut and the input/output leads 28 are bent, so that discrete remote control photodetector units similar to those shown in FIGS. 11A through 11C are obtained.

In the embodiment, as described above, the shielding case banks are formed in which the shielding cases 21 are arranged at double the pitch of the molded articles 27 in the molded article bank. The two shielding case banks 30 and 31 are stacked one on top of the other in an overlapping manner with displacement from each other by half the pitch so as to form the combined shielding case banks in which the shielding cases 21 are as a whole arranged at the pitch as large as that of the molded articles 27. The stacked shielding case banks are mounted on the molded article bank, and the front face, the side faces, and the top face of each molded article 27 are thereby covered with a corresponding single shielding case 21. By the crimping operation, each of the molded articles 27 and the associated shielding case 21 are fixed to each other, and the back face of each molded article 27 is covered. After that, the guide frames 22 are sequentially separated off the shielding case banks 30 and 31 at the V notches 25.

Accordingly, an efficiency of the casing of the molded article bank with shielding cases can significantly be increased in comparison with conventional casing methods in which separate shielding cases are mounted on and fixed to molded articles in the molded article bank.

In the embodiment described above, the pitch of the shielding cases 21 in the shielding case banks 30, 31 is twice as large as the pitch of the molded articles 27 in the molded article bank. Provided that the pitch of the shielding cases 21 is n times as large as the pitch of the molded articles 27, in general, n shielding case banks may be stacked so that all the shielding cases 21 constituting the n shielding case banks are arranged at a pitch as large as that of the molded articles 27 in the molded article bank.

In the above description, the molded article bank is collectively cased at a time by using two plate-like shielding case banks that are stacked one on top of the other with displacement from each other by half the pitch (corresponding to one pitch of the molded articles). Instead of that, the casing of the molded article bank may be performed by first attaching one shielding case bank and cutting the guide frame 22 and then attaching the other shielding case bank with displacement from the first one by half the pitch and cutting the guide frame 22. In this method, a working efficiency is halved in comparison with the casing of the molded article bank all at once. Still, this method is far more efficient than the conventional method in which shielding cases are used piece by piece for the casing of the molded articles 27 of the molded article bank.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a semiconductor device in which a molded article having a semiconductor chip sealed with resin is covered with a shielding case, comprising:
   preparing a molded article bank in which a plurality of said molded articles are connected in parallel by a guide frame;
   preparing a shielding case bank in which a plurality of shielding cases are connected in parallel by a guide frame;
   overlaying the shielding case bank on the molded article bank in such a manner that the shielding cases each cover a corresponding one of the molded articles; and
   dividing the molded article bank covered with the shielding case bank into discrete articles, wherein the shielding cases are arranged in the shielding case bank only at a pitch of n (n: a positive integer of not less than two) times as large as a pitch at which the molded articles are arranged in the molded article bank, and the overlaying the shielding case bank on the molded article bank comprises putting n shielding case banks one on top of another in an overlapping manner such that the shielding cases of the n banks are arranged as a whole at a same pitch as the pitch of the molded articles in the molded article bank.

2. A method as claimed in claim 1, wherein the shielding cases and the guide frame in the shielding case bank are formed of an identical plate material, and the shielding cases and the guide frame are connected through corresponding plate-like joints protruding from one side of the guide frame at specified intervals.

3. A method as claimed in claim 2, wherein the joints are contiguous on one side of front faces of the shielding cases.

4. A method as claimed in claim 3, wherein each joint is provided with a separator for separating the associated shielding case from the guide frame, at a boundary between the shielding case and the joint.

5. A method as claimed in claim 4, wherein the separator comprises a groove extending from one side to the other side of the joint, and the separation of each shielding case from the guide frame is achieved by bending the guide frame relative to the shielding case around the groove serving as a fulcrum.

6. A method as claimed in claim 5, wherein the groove is formed on a surface of the joint that continues from the front face of the associated shielding case.

7. A method as claimed in claim 1, wherein when the overlapping n shielding case banks are overlaid on the molded article bank and surfaces of the molded articles are brought into close contact with back faces of the shielding cases, possible strain in the molded articles caused by a difference in level between the shielding case banks is absorbed by flexure of leads that connect molded parts of the molded articles to the guide frame.

8. A method as claimed in claim 1, wherein when the overlapping n shielding case banks are overlaid on the molded article bank and front faces of the shielding cases are made flush with each other, possible strain caused on borders between joints and the shielding cases is absorbed by deformation at locations of separation of the guide frame.

9. A method as claimed in claim 1, wherein the guide frame of each shielding case bank has holes corresponding to the shielding cases, and the method comprising:

pushing the guide frame of one of two adjacent shielding case banks by ejector pins extending through the holes of the guide frame of the other of the two adjacent shielding case banks so as to bend the guide frame of the one of the two adjacent shielding case from boundaries between the shielding cases and the guide frame for cutting of the guide frame.

10. A method as claimed in claim 9, wherein upon overlaying the overlapping n shielding case banks on the molded article bank, each hole provided in the guide frame of each shielding case bank is placed between leads connecting a molded part of the molded article and the guide frame of the molded article bank.

11. A method as claimed in claim 9, wherein the holes provided in the guide frames of the shielding case banks double as feeding holes that are used when the shielding case banks are manufactured.

12. A method as claimed in claim 1, wherein the semiconductor chip includes a photodetector element for converting received light into electric signal.

* * * * *